(12) United States Patent
Soogoori

(10) Patent No.: US 7,519,896 B2
(45) Date of Patent: Apr. 14, 2009

(54) TURBO ENCODER AND RELATED METHODS

(75) Inventor: Shashi Kiran Rao Soogoori, Wanaparthy (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 536 days.

(21) Appl. No.: 11/233,314

(22) Filed: Sep. 22, 2005

(65) Prior Publication Data

US 2006/0069978 A1 Mar. 30, 2006

(30) Foreign Application Priority Data

Sep. 22, 2004 (IN) ............... 1796/DEL/2004

(51) Int. Cl.
*H03M 13/03* (2006.01)
(52) U.S. Cl. ..................................... 714/786
(58) Field of Classification Search ............. 714/755, 714/786
See application file for complete search history.

(56) References Cited

U.S. PATENT DOCUMENTS 6,304,991 B1  10/2001  Rowitch et al. ............. 714/755
6,718,504 B1 *  4/2004  Coombs et al. ............. 714/755
7,051,261 B1 *  5/2006  Dhamankar ................. 714/755

FOREIGN PATENT DOCUMENTS

GB    2377146      12/2002
WO    WO0229977    4/2002

* cited by examiner

*Primary Examiner*—Shelly A Chase
(74) *Attorney, Agent, or Firm*—Lisa K. Jorgenson; Allen, Dyer, Doppelt, Milbrath & Gilchrist, P.A.

(57) ABSTRACT

A turbo encoder includes multiple interleaved parallel concatenated recursive systematic convolutional encoders wherein each recursive systematic convolutional encoder is provided with an LUT that simultaneously provides the output bit pattern as well as the next state value corresponding to a defined set of multiple input bits and present state for operating the recursive systematic convolutional encoder. Thus, the approach works with LUTs, which do the job of both puncturing and multiplexing for four input bits at a time. The proposed approach may operate almost four times faster than the conventional approach, which can handle only one input bit at a time.

8 Claims, 4 Drawing Sheets

Input word:

| $S_1$ | $S_2$ | $S_3$ | $S_4$ | ... | $S_{30}$ | $S_{31}$ | $S_{32}$ |
|---|---|---|---|---|---|---|---|

Output 1st word:

| $S_1$ | $P_1^1$ | $P_1^2$ | $S_2$ | $P_2^1$ | $P_2^2$ | $S_3$ | $P_3^1$ | $P_3^2$ | $S_4$ | $P_4^1$ | $P_4^2$ | ... | $S_{11}$ | $P_{11}^1$ |
|---|---|---|---|---|---|---|---|---|---|---|---|---|---|---|

Output 2nd word:

| $P_{11}^2$ | ... | $S_{22}$ |
|---|---|---|

Output 3rd word:

| $P_{22}^1$ | $P_{22}^2$ | ... | $S_{30}$ | $P_{30}^1$ | $P_{30}^2$ | $S_{31}$ | $P_{31}^1$ | $P_{31}^2$ | $S_{32}$ | $P_{32}^1$ | $P_{32}^2$ |
|---|---|---|---|---|---|---|---|---|---|---|---|

| Present State | Input | Next State | Parity Output |
|---|---|---|---|
| 0 | 0 | 0 | 0 |
| 0 | 1 | 4 | 1 |
| 1 | 0 | 4 | 0 |
| 1 | 1 | 0 | 1 |
| 2 | 0 | 5 | 1 |
| 2 | 1 | 1 | 0 |
| 3 | 0 | 1 | 1 |
| 3 | 1 | 5 | 0 |
| 4 | 0 | 2 | 1 |
| 4 | 1 | 6 | 0 |
| 5 | 0 | 6 | 1 |
| 5 | 1 | 2 | 0 |
| 6 | 0 | 7 | 0 |
| 6 | 1 | 3 | 1 |
| 7 | 0 | 3 | 0 |
| 7 | 1 | 7 | 1 |

Input word:

| $S_1$ | $S_2$ | $S_3$ | $S_4$ | : : : : : : : : : : : : : : : : : : : : | $S_{30}$ | $S_{31}$ | $S_{32}$ |

Output 1st word:

| $S_1$ | $P_1^1$ | $P_1^2$ | $S_2$ | $P_2^1$ | $P_2^2$ | $S_3$ | $P_3^1$ | $P_3^2$ | $S_4$ | $P_4^1$ | $P_4^2$ | : : : | $S_{11}$ | $P_{11}^1$ |

Output 2nd word:

| $P_{11}^2$ | : : : : : : : : : : : : : : : : : : : : : : : : : : | $S_{22}$ |

Output 3rd word:

| $P_{22}^1$ | $P_{22}^2$ | : : : : : : : : : | $S_{30}$ | $P_{30}^1$ | $P_{30}^2$ | $S_{31}$ | $P_{31}^1$ | $P_{31}^2$ | $S_{32}$ | $P_{32}^1$ | $P_{32}^2$ |

| Present State | Input (in binary) | Next State and Output Pattern (in binary) |
|---|---|---|
| 0 | 0000 | 0000 000 000 000 000 |
| 0 | 0001 | 0100 000 000 000 110 |
| 0 | 0010 | 0010 000 000 110 010 |
| 0 | 0011 | 0110 000 000 110 100 |
| - | ---- | -------------------- |

| Present State | Input (in binary) | Next State and Output Pattern (in binary) |
|---|---|---|
| 0 | 0000 | 0000 000 000 000 000 |
| 0 | 0001 | 0100 000 000 000 001 |
| 0 | 0010 | 0010 000 000 001 001 |
| 0 | 0011 | 0110 000 000 001 000 |
| - | ---- | -------------------- |

| For first RSC | 6 | | | | | | | | | | | |
|---|---|---|---|---|---|---|---|---|---|---|---|---|
| Next State | $S_j^1$ | $P_j^1$ | 0 | $S_{j+1}^1$ | $P_{j+1}^1$ | 0 | $S_{j+2}^1$ | $P_{j+2}^1$ | 0 | $S_{j+3}^1$ | $P_{j+3}^1$ | 0 |

| For second | 7 | | | | | | | | | | | |
|---|---|---|---|---|---|---|---|---|---|---|---|---|
| Next State | 0 | 0 | $P_j^2$ | 0 | 0 | $P_{j+1}^2$ | 0 | 0 | $P_{j+2}^2$ | 0 | 0 | $P_{j+3}^2$ |

For first RSC ← 8 bit pattern →

| Next State | | $X_j^1$ | $Y_j^1$ | $X_{j+1}^1$ | 0 | $X_{j+2}^1$ | $Y_{j+2}^1$ | $X_{j+3}^1$ | 0 |
|---|---|---|---|---|---|---|---|---|---|

For second RSC

| Next State | | 0 | 0 | 0 | $Y'_{j+1}^1$ | 0 | 0 | 0 | $Y'_{j+3}^1$ |
|---|---|---|---|---|---|---|---|---|---|

Figure 9

For first RSC ← 20 bit →

| Next State | | $X_1$ $Y_1$ $Z_1$ 0 0 $X_2$ $Y_2$ $Z_2$ 0 0 $X_3$ $Y_3$ $Z_3$ 0 0 $X_4$ $Y_4$ $Z_4$ 0 0 |
|---|---|---|

For second RSC ← 20 bit →

| Next State | | 0 0 0 $Y'_1$ $Z'_1$ 0 0 0 $Y'_2$ $Z'_2$ 0 0 0 $Y'_3$ $Z'_3$ 0 0 0 $Y'_4$ $Z'_4$ |
|---|---|---|

Figure 10

For first RSC ← 16 bit →

| Next State | | $X_1$ $Y_1$ $Z_1$ 0 $X_2$ $Y_2$ 0 0 $X_3$ $Y_3$ $Z_3$ 0 $X_4$ $Y_4$ 0 0 |
|---|---|---|

For second RSC ← 16 bit →

| Next State | | 0 0 0 $Z'_1$ 0 0 $Y'_2$ $Z'_2$ 0 0 0 $Z'_3$ 0 0 $Y'_4$ $Z'_4$ |
|---|---|---|

Figure 11

TURBO ENCODER AND RELATED METHODS

FIELD OF THE INVENTION

The present invention relates to the field of turbo encoders and related methods.

BACKGROUND OF THE INVENTION

Turbo coding is an advanced error correction technique widely used in the communications industry. Turbo encoders and decoders are key elements in today's communication systems to achieve the best possible data reception with least possible errors. The basis of turbo coding is to introduce redundancy in the data to be transmitted through a channel by serial/parallel concatenation of convolutional encoders. Using this redundant data the component decoders working iteratively help to recover original data from the received data. This feature makes turbo encoding all the more popular.

FIG. 1 shows a Wideband Code Division Multiple Access (WCDMA) turbo encoder specified in the 3GPP TS 25.212 specification entitled "Multiplexing and channel coding (FDD)". The WCDMA turbo encoder includes parallel-concatenated recursive systematic convolutional encoders (RSC) with random interleaver in between. The first RSC (3) works on actual input data and the second RSC (4) works on interleaved data provided by the interleaver (2).

The input to the turbo encoder (1) is a 32-bit packet and the output from the turbo encoder (1) is also a 32-bit packet resulting from multiplexed output of both RSCs (3 & 4) by puncturing the non-systematic bit of the second RSC (4). As one stream of input bit results in three output bit streams, the rate of this turbo code is 1/3. After finishing encoding of the input bits both the RSCs (3 & 4) are flushed out such that the state of both RSCs (3 & 4) becomes zero. While flushing the encoder (1), the output tail bits of the first RSC (3) systematic bit followed by parity bit are packed along with the encoded stream. Similarly the output tail bits of the second RSC (4) non-systematic bit followed by parity bit are packed to the output stream.

In a conventional approach, the parity output of the RSC with respect to state, follows a $1^{st}$ order Markov chain. The conventional approach uses a Look-Up Table (LUT) which gives next state and the output for the given input and present state. The WCDMA turbo encoder table is shown in FIG. 2. The input to the $1^{st}$ RSC is given bit by bit from the input data and the input to the $2^{nd}$ RSC is given from the input data by using a pre-calculated interleaver table. The input systematic bit is packed with the output parity bits of both the RSCs in an output register.

As both input and output are 32 bit packed and each encoder parity output depends on the present state, the implementation involves many logical, shift and memory read/write operations. It requires at least one memory read for encoding a single bit to get output or next state information for each RSC and also needs masking of the required bits and shifting to their respective positions and packing with the output register. The above steps are repeated 32 times to process each 32 bit packed input and whenever the output register is full of 32 bits it is stored to the output array.

Further the conventional approach used for implementing turbo coding processes one input bit at a time. This approach consumes many resources and includes many operations. A new approach, which operates on four input bits at a time, has been proposed.

SUMMARY OF THE INVENTION

To address the above mentioned drawbacks, an object of the present invention is to provide an improved turbo encoder. Another object of the invention is to provide an encoder that operates on multiple bits simultaneously.

To achieve the aforementioned objects the invention provides a turbo encoder comprising multiple interleaved parallel concatenated recursive systematic convolutional encoders wherein each recursive systematic convolutional encoder is provided with an LUT that simultaneously provides the output bit pattern as well as the next state value corresponding to a defined set of multiple input bits and present state for operating the recursive systematic convolutional encoder. The LUT may be shared across multiple recursive systematic convolutional encoder.

A method for turbo encoding includes: determining a first output bit pattern corresponding to received multiple input bits of an input bit stream using an LUT; interleaving the input bit stream to provide multiple interleaved output bit streams; determining a second output bit pattern for multiple bits of each multiple interleaved output bit stream using an LUT; generating the output bit stream from the first and secondary output bit patterns wherein all the output bit patterns are generated using LUTs operating on a set of multiple bit at a time.

Each output bit pattern of the LUT may be generated by a state machine for multiple input bits. The LUT provides the next state information generated by the state machine as per multiple input bits and present state.

BRIEF DESCRIPTION OF THE DRAWINGS

FIG. 9 shows an output pattern for LUT1 and LUT2 for rate 1/2 CDMA2000 turbo encoder.

FIG. 10 shows an output pattern for LUT1 and LUT2 for rate 1/5 CDMA2000 turbo encoder.

FIG. 11 shows an output pattern for LUT1 and LUT2 for rate 1/4 CDMA2000 turbo encoder.

DETAILED DESCRIPTION OF THE PREFERRED EMBODIMENTS

The instant invention is explained for encoding four bits simultaneously at the rate 1/3 as an example. However it is not limited to the values and any person skilled in the art can use it for other rates and different number of bits as well. The proposed approach can be extended to implement encoding in different applications such as a CDMA2000 turbo encoder.

Figures 1, 2:
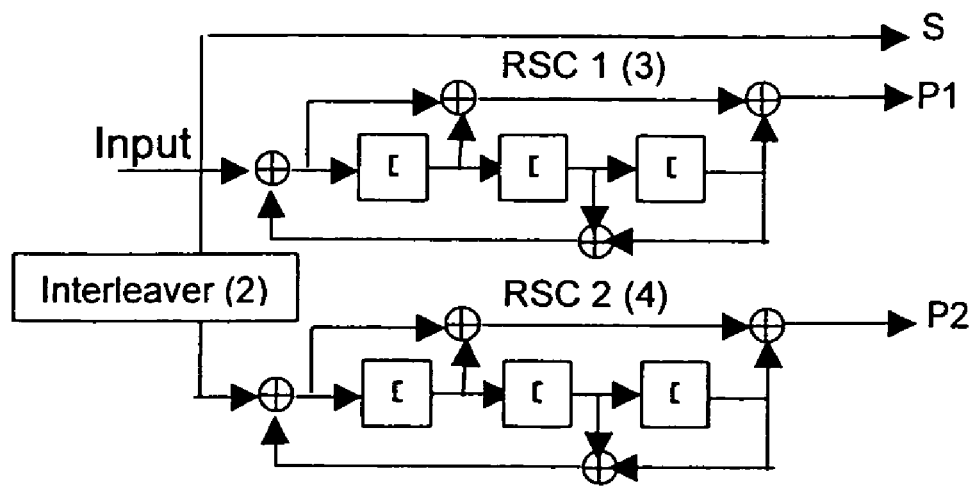
FIG. 1 shows a WCDMA turbo encoder specified in 3GPP TS 25.212 specifications.
FIG. 2 illustrates a WCDMA turbo encoder table for calculating next state and parity output.

FIG. 2 shows the input and output words being encoded at the rate of 1/3. The encoding of a complete 32 bit word, results in three 32 bit output words. The $S_j$ is the $j^{th}$ systematic bit; $P_j^1$ is parity output of first RSC and $P_j^2$ is parity output of second RSC. The systematic input, parity output of first RSC (3) and the second RSC (4) are distributed amongst the three output words, each separated by two bits. Thus four input bits are continuously encoded with each RSC (3 or 4) following its own LUT for calculating an output pattern of 12 bits each. The result of both RSCs (3 & 4) is 'OR'ed to obtain the actual output pattern. The above mentioned LUT also provides the next-state information apart from the output pattern.

Figures 3, 4, 5, 6:
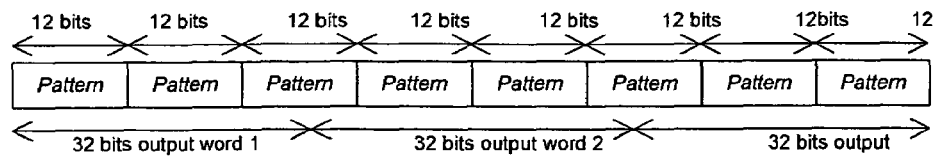
FIG. 3 shows an output word format after completion of turbo encoding for 32 bit input word.
FIG. 4 shows a first RSC's LUT for calculating next state and the output pattern.
FIG. 5 shows a second RSC's LUT for calculating next state and the output pattern.
FIG. 6 shows an output word packing using patterns obtained from both RSCs.

The LUTs for both RSCs (3 & 4) of turbo encoder shown in FIG. 1 are shown in FIGS. 4 & 5 respectively for only a few combinations of the input and the present-state. The LUT of first RSC (3) contains systematic and parity output bits for the four continuous input bits. The LUT of second RSC (4) contains only parity output bits for four continuous input bits as non-systematic bits are punctured. The description of the table formation is explained in detail in the next section.

The approach works in two parts. Since the input is an array of 32 bits, the input bits, which are complete 32 bit packed are handled in the first part and the incomplete bits in the last word are handled in the second part. The proposed new approach is used in the first part and the conventional approach is used for the second part.

Since a nibble of four bits is encoded at a time, the inner loop runs eight times to finish the encoding of 32 bits resulting in eight output patterns and the outer loop runs the number of times the number of words are to be encoded. The non-systematic input bits to the second RSC (4) are packed into a 32 bit register using pre-calculated interleaver table before the onset of the encoding of the inner loop. Once encoding of the inner loop is completed, all the eight output patterns are packed into the three words. The output words are packed from patterns according to the word boundaries, as shown in FIG. 6. Thus, the outer loop includes the non-systematic bit packing and output packing apart from encoding the inner loop. The remaining bits in last incomplete word can at most be 31 bits, which can be processed one bit at a time with the conventional method.

LUT Generation

As described above, for every four bits, the output pattern results from both RSCs (3 & 4) and the parity output positions therein obtained from both the RSCs (3 & 4) are different thereby requiring individual LUTs for each RSC. Each element of the LUT requires 16 bits, upper 4 bits represent the next-state and the lower 12 bits represents the output pattern of the corresponding RSC. For a given state there are sixteen different combinations of inputs ($2^4$=16), and eight such possible states in case of WCDMA turbo encoder, which is containing 3 memory elements ($2^3$=8). Therefore the table size of each LUT is 256 bytes (128 elements and each of 2 bytes).

LUT1 for First RSC

For all possible states and input bits, the parity output bits after every input bit and next state after four continuous input bits are calculated using FIG. 2. As the output steam contains systematic bits, the input bits and parity bits are placed in respective positions to follow the output word format described in FIG. 3. The positions where the parity output from second RSC is to be placed are filled with zeros. Accordingly, the LUT1 pattern (6) for first RSC (3) looks as described in FIG. 7.

LUT2 for Second RSC

Figures 7, 8:
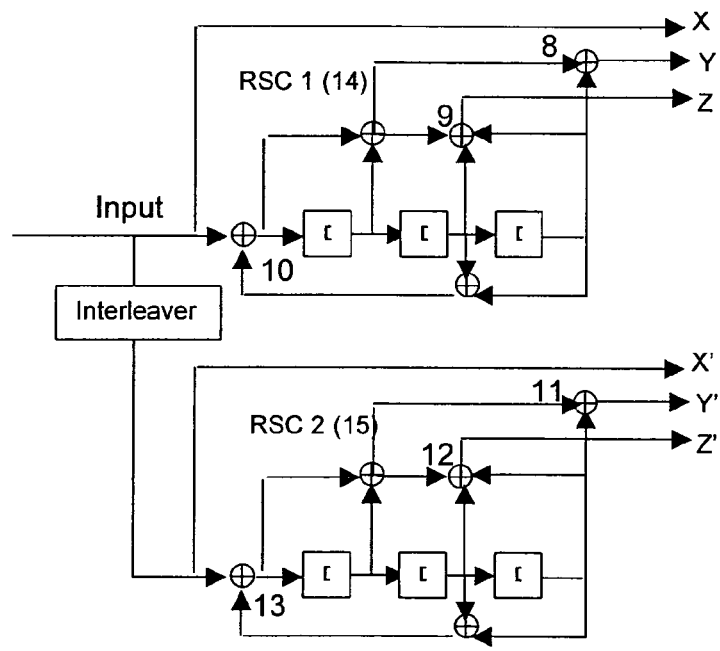
FIG. 7 shows an output pattern for LUT1 and LUT2.
FIG. 8 shows a CDMA2000 Turbo encoder specified in 3GPP2 C.S0002-D.

The LUT2 pattern (7) for the second RSC (4) is shown in FIG. 7. The party output bit after every input bit and the next state after four continuous input bits are calculated using FIG. 2. In the second RSC (4), the output is only the parity output.

Hence the parity output bits of second RSC (4) are placed in respective positions and the position where the systematic and parity output bits from first RSC are to be placed is filled by zeros.

Complexity Analysis and Comparison

The complexity of this approach is analyzed against the conventional approach. As per the proposed approach, it encodes a 4 bit input pattern into 12 bit output pattern and requires two memory loads, a single 'OR' operation and a mask operation for the required pattern. The updating next state of each RSC takes one mask and one shift operations for every 4 input bits. Also, it consumes few more logical operations for packing of non-systematic bits and packing of output patterns into output words. Using a conventional approach, each RSC requires one memory read, one mask operation for the required bit, and one shift operation for the respective position and 'OR' operation for packing to the result. Also few more logical operations are required for un-packing of systematic input word.

The proposed approach explained on WCDMA rate 1/3, however runs four times faster than the conventional approach, as it requires only one fourth of the operations. Further it can be extended to other standards such as CDMA2000 turbo encoding which supports various rates by puncturing.

The CDMA2000 turbo encoder shown in FIG. 8 supports various coding rates 1/2, 1/3, 1/4 and 1/5 with two feed forwards polynomials (8 & 9) ($1+D+D^3$, $1+D+D^2+D3$) and one feed back polynomial (10) ($1+D^2+D^3$). The proposed LUTs are used for encoding. The calculation of contents of both LUTs is explained further. Care should be taken according to the coding rate and puncturing while calculating output pattern of LUTs.

The output streams for different rates from CDMA2000 turbo encoder look as follows.

For rate 1/2: $X_1, Y_1, X_2, Y'_2, X_3, Y_3, X_4, Y'_4$
For rate 1/3: $X_1, Y_1, Y'_1, X_2, Y_2, Y'_2, X_3, Y_3, Y'_3, X_4, Y_4, Y'_4$
For rate 1/4: $X_1, Y_1, Z_1, Z'_1, X_2, Y_2, Y'_2, Z'_2, X_3, Y_3, Z_3, Z'_3, X_4, Y_4, Y'_4, Z'_4$
For rate 1/5: $X_1, Y_1, Z_1, Y'_1, Z'_1, X_2, Y_2, Z_2, Y'_2, Z'_2, X_3, Y_3, Z_3, Y'_3, Z'_3, X_4, Y_4, Z_4, Y'_4, Z'_4$ For rate 1/3, the LUTs remain the same as that of WCDMA as there is no difference in encoding. In case of rate 1/2, along with systematic bit $X_i$ either the parity of RSC1 $Y_i$ or RSC2 $Y'_i$ is sent alternatively. Each element of LUT requires 16 bits, the upper 4 bits represents the next-state while the lower 8 bits represent output pattern of the corresponding RSC as shown in FIG. 9 and the remaining 4 bits are unused. Zeros in LUTs fill the unused portion of bits. After packing such eight output patterns, the output of complete 32 bit word input is formed into two 32 bit output words (8*8 bits=64 bits). The table size of each LUT required is 256 bytes (128 elements and each of 2 bytes).

For the rate 1/5 each element of the LUT requires more than 16 bits so the element size can be 32 bits. The upper 4 bits represents the next-state while the lower 20 bits represents the output pattern of corresponding RSC as shown in FIG. 10. After packing eight such output patterns the output of a complete 32 bit word input is formed into five 32 bit output words (8*20 bits=160 bits). The table size of each LUT required is 512 bytes (128 elements and each of 4 bytes).

For rate 1/4 also each element of LUT requires more than 16 bits so the element size can be 32 bits. The upper 4 bits represents the next-state while the lower 16 bits represents the output pattern of corresponding RSC as shown in FIG. 11. After packing eight such output patterns the output of complete 32 bit word input is formed into four 32 bit output words (8*16 bits=128 bits). The table size of each LUT required is 512 bytes (128 elements and each of 4 bytes).

Thus, an improved turbo encoding has been proposed and compared against the computations required with a conventional method. This improved turbo encoding handles 4 bits at a time, and the same logic can be extended for 8 input bits at a time, as the cost of 32 times memory, which is not advisable. The proposed approach is described in detail for a WCDMA turbo encoder. A brief idea for implementing this in other standards such as CDMA2000, which can support other coding rates such as 1/2, 1/4 and 1/5 apart from 1/3, is also presented. The approach works efficiently for all coding rates, as the LUT inherently does the job of puncturing and multiplexing according to the coding rate.

That which is claimed is:

1. A turbo encoder comprising interleaved parallel concatenated recursive systematic convolutional encoders wherein each recursive systematic convolutional encoder includes a Look-Up-Table (LUT) that simultaneously provides an output bit pattern as well as a next state value corresponding to a defined set of multiple input bits and present state for operating the corresponding recursive systematic convolutional encoder.

2. The turbo encoder as claimed in claim 1 wherein each LUT is shared across the recursive systematic convolutional encoders.

3. A turbo encoder comprising:
   a plurality of interleaved parallel concatenated recursive systematic convolutional encoders;
   each recursive systematic convolutional encoder including a Look-Up-Table (LUT) for operation thereof, the LUT simultaneously providing an output bit pattern and a next state value corresponding to a defined set of multiple input bits and present state.

4. The turbo encoder as claimed in claim 3 wherein each LUT is shared across the recursive systematic convolutional encoders.

5. The turbo encoder as claimed in claim 4 wherein the plurality of interleaved parallel recursive systematic convolutional encoders define a Wideband Code Division Multiple Access (WCDMA) turbo encoder.

6. A method for turbo encoding as claimed in claim 5 wherein each of the first and second output bit patterns is generated by a state machine for multiple input bits.

7. A method for turbo encoding comprising:
   determining a first output bit pattern corresponding to received multiple input bits of an input bit stream using a first Look-Up-Table (LUT);
   interleaving the input bit stream to provide multiple interleaved output bit streams;
   determining a second output bit pattern for multiple bits of each multiple interleaved output bit stream using a second LUT; and
   generating the output bit stream from the first and second output bit patterns wherein the first and second output bit patterns are determined using the first and second LUTs operating on a set of multiple bits at a time.

8. A method for turbo encoding as claimed in claim 7 wherein each LUT provides a next state value generated by the state machine based upon multiple input bits and a present state.

* * * * *

UNITED STATES PATENT AND TRADEMARK OFFICE
CERTIFICATE OF CORRECTION

PATENT NO. : 7,519,896 B2  
APPLICATION NO. : 11/233314  
DATED : April 14, 2009  
INVENTOR(S) : Soogoori Page 1 of 1

It is certified that error appears in the above-identified patent and that said Letters Patent is hereby corrected as shown below:

| | |
|---|---|
| Column 3, Line 36 | Delete: "in last"<br>Insert: --in the last-- |
| Column 3, Line 48 | Delete: "24"<br>Insert: --$2^4$-- |
| Column 3, Line 50 | Delete: "23"<br>Insert: --$2^3$-- |
| Column 4, Line 29 | Delete: "D3"<br>Insert: --$D^3$-- |
| Column 4, Line 46 | Delete: "of LUT"<br>Insert: --of the LUT-- |

Signed and Sealed this

Eighteenth Day of August, 2009

David J. Kappos  
*Director of the United States Patent and Trademark Office*